(12) United States Patent
Nauerth

(10) Patent No.: US 6,392,412 B1
(45) Date of Patent: May 21, 2002

(54) METHOD OF CORRECTING HIGHER ORDER FIELD INHOMOGENEITIES IN A MAGNETIC RESONANCE APPARATUS

(75) Inventor: Arno Nauerth, Erlenbach (DE)

(73) Assignee: Bruker Medical GmbH, Rheinstetten (DE)

(*) Notice: Subject to any disclaimer, the term of this patent is extended or adjusted under 35 U.S.C. 154(b) by 0 days.

(21) Appl. No.: 09/705,823

(22) Filed: Nov. 6, 2000

(30) Foreign Application Priority Data

Nov. 16, 1999 (DE) .......................................... 199 54 925

(51) Int. Cl.[7] .................................................. G01V 3/00
(52) U.S. Cl. ...................................... 324/320; 324/319
(58) Field of Search ................................ 324/320, 319, 324/318, 314, 309, 307, 300

(56) References Cited

U.S. PATENT DOCUMENTS

| | | | |
|---|---|---|---|
| 5,184,075 A | * | 2/1993 | Nishimura .................. 324/320 |
| 5,345,178 A | | 9/1994 | Manabe et al. |
| 5,770,943 A | * | 6/1998 | Zhou .......................... 324/320 |
| 5,823,959 A | * | 10/1998 | Rasche ........................ 324/320 |

* cited by examiner

Primary Examiner—Louis Arana
(74) Attorney, Agent, or Firm—Paul Vincent

(57) ABSTRACT

The invention concerns a method of correcting field inhomogeneities of higher order in a magnetic resonance apparatus After an excitation pulse and action of a phase gradient in a predetermined direction p, a data point is recorded after two predetermined times $t_{d1}$ and $t_{d2}$. This is repeated for systematically modified strengths of the phase gradient and constant $t_{d1}$ and $t_{d2}$, and two sets of signal dependences in the p direction are obtained. The two phase dependences of the two Fourier transformed data sets in the p direction are subtracted. The profile of the difference phase in the p direction corresponds to a field error profile. The method is repeated for several p directions, and coefficients of higher order of a series expansion of the field inhomogeneities in spherical harmonic functions are obtained.

19 Claims, 1 Drawing Sheet

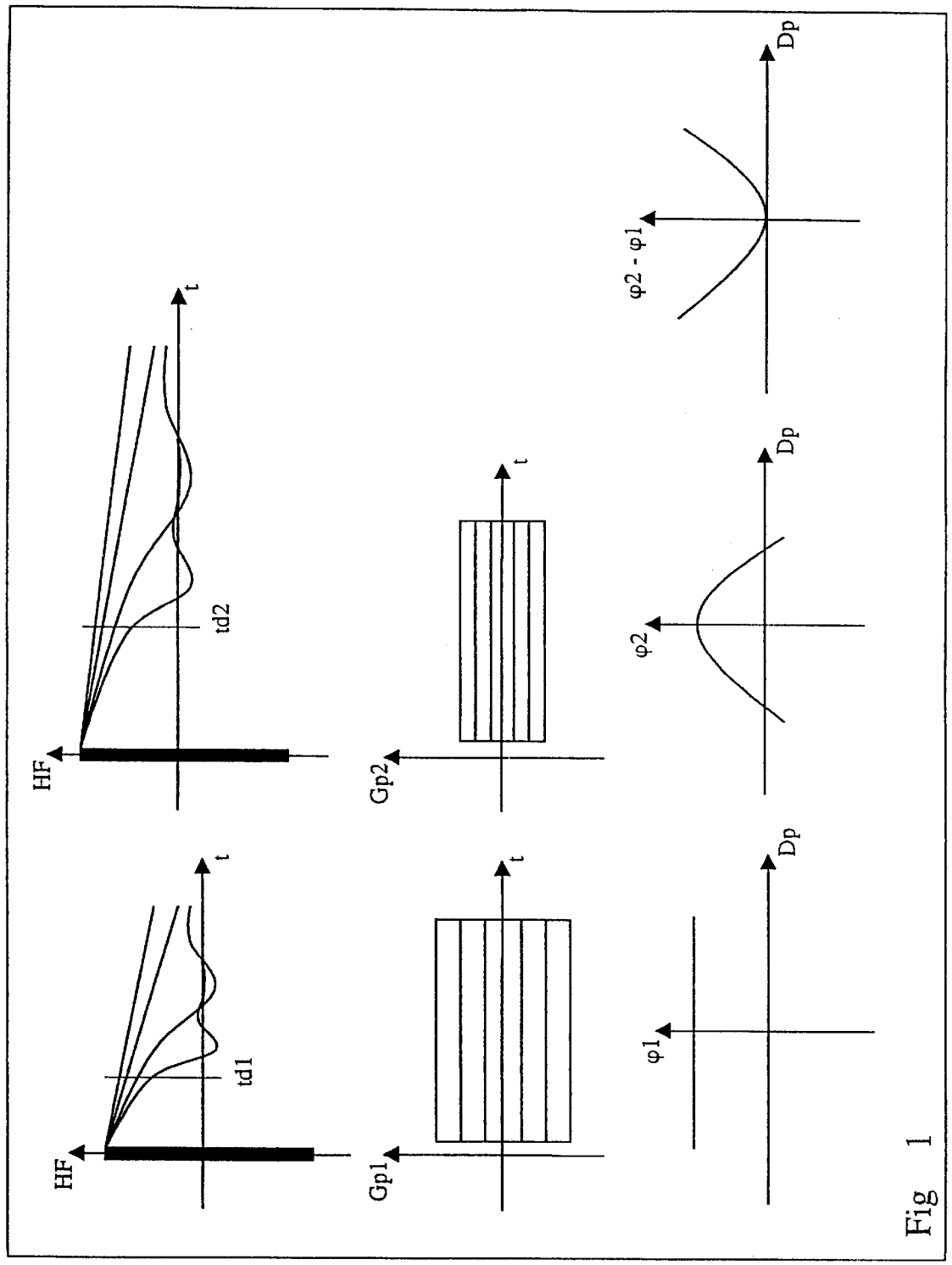

METHOD OF CORRECTING HIGHER ORDER FIELD INHOMOGENEITIES IN A MAGNETIC RESONANCE APPARATUS

This application claims Paris Convention priority of DE 199 54 925.7 filed Nov. 16, 1999 the complete disclosure of which is hereby incorporated by reference.

BACKGROUND OF THE INVENTION

The present invention is related to the invention "Method of Correcting Linear Field Inhomogeneities in a Magnetic Resonance Apparatus" which was filed claiming prority of DE 199 54 926.5 filed Nov. 16, 1999 the full disclosure of which is hereby incorporated by reference. The two methods can complement one another in an advantageous fashion. The cited method can precede the present method to eliminate linear field inhomogeneities in advance.

The present invention concerns a method of determining and correcting higher order magnetic field inhomogeneities of a nearly homogeneous magnetic field $B_0$ in the investigation volume of a nuclear magnetic resonance apparatus, wherein magnetic resonance is excited in a sample located in the investigation volume through a radio frequency pulse, at least one additional linear magnetic gradient field is applied, and a magnetic resonance signal is measured.

A method of this type is e.g. known from U.S. Pat. No. 5,345,178 for a nuclear magnetic tomography apparatus.

In the known method, a gradient or spin echo sequence is measured after radio frequency excitation of a sample. The NMR signal is then Fourier transformed and a phase profile is determined within a predetermined area. This procedure is repeated for a plurality of projection directions and the phase curves obtained are analyzed with a fit method. Coefficients of a series expansion of the magnetic field dependence in spherical harmonic functions are determined therefrom and correction currents are, in turn, calculated for individual shim or gradient coils associated with the coefficients.

The known method has i.a. the disadvantages that the chemical shift between water and fatty constituents of the signal produces undesired geometric shifts and it cannot be applied or only disadvantageously with samples with short $T_1/T^*_2$ times.

For this reason, there is a need for a rapid, uncomplicated, direct shimming method which can be made insensitive to the influences of chemical shifts and which can also be successfully applied with samples having short relaxation times.

SUMMARY OF THE INVENTION

This object is achieved by a method of the above-mentioned type comprising the following steps:

A) a first radio frequency excitation pulse is irradiated onto the sample;

B) a first phase gradient $G_{ix}$ is applied in a predetermined direction x;

C) at a fixed time $t_{dx1}$ after the first radio frequency excitation pulse, a value $S_{ix1}$ of the magnetic resonance signal from the sample is measured, digitized and stored;

D) a second radio frequency excitation pulse is irradiated onto the sample;

E) a second phase gradient $G_{ix2}$ is applied in the predetermined direction x;

F) at a fixed time $t_{dx2}$ after the second radio frequency excitation pulse, a value $S_{ix2}$ of the magnetic resonance signal from the sample is measured, digitized and stored, wherein $G_{ix2}$ and $t_{dx2}$ are selected such that the integrals $$\int_0^{t_{dx1}} Gx1\,dt = \int_0^{t_{dx2}} Gx2\,dt$$

are identical;

G) the steps A) to F) are repeated several times with systematically altered strength of the phase gradient $G_{ix}$;

H) the values of the measured resonance signals $S_{ix1}$ are combined, in dependence on the associated gradient strength $G_{ix}$, into a quasi-spin echo data set $S_{x1}$;

I) the values of the measured resonance signals $S_{ix2}$ are combined, in dependence on the associated gradient strength $G_{ix}$, into a quasi-spin echo data set $S_{x2}$;

J) the data set $S_{x1}$ is Fourier transformed and optionally phase-corrected such that the phases $\phi_{ix1}$ of the phase-corrected resonance signals $S'_{ix1}$ all have essentially the same value;

K) the data set $S_{x2}$ is also Fourier transformed and phase-corrected with the same parameters as the data set $S_{x1}$ in step J), wherein the difference $\phi_{ix1}-\phi_{ix2}$ of the phase-corrected phases of the signals $S'_{ix1}$ and $S'_{ix2}$ represent a measurement for a profile of the magnetic field inhomogeneity along the direction x;

L) in the following measurements of magnetic resonance in the apparatus, a correction magnetic field $B(x)$ is applied in the investigation volume for homogenizing the magnetic field B. which compensates for the magnetic field inhomogeneity determined in step K).

One single measuring point is recorded at each of two defined points in time following each excitation rather than a complete signal echo or FID. The times $t_{d1}$ and $t_{d2}$ are always the same as is therefore the dephasing due to inhomogeneities of the magnetic field B0. Through application of a phase gradient in the interval between t=0 and $t=t_{d1}$ or between t=0 and $t=t_{d2}$, additional dephasing is produced which can be controlled in a defined manner. At the times of data recording, the two effects overlap. The gradient strengths are selected such that each measuring value at $t_{d1}$ has a corresponding one at $t_{d2}$ which has the same dephasing due to the applied phase gradient but not due to the field inhomogeneity of $B_0$. Evaluation according to the above-mentioned steps produces a phase difference profile in the direction of the applied phase gradient which, except for the $T_2$ relaxation effects, depends only on the effect of the $B_0$ inhomogeneity in this direction. The phase correction mentioned in step J) is optional: it is only important that the same phase correction is applied for both data sets.

The number of required excitations can be reduced if the times $t_{d1}$ and $t_{d2}$ and the gradient strengths are in rational relationship to one another. It is then possible to use one measuring point for at least some gradient strengths of the phase gradient with both $t_{d1}$ and $t_{d2}$, wherein the one at $t_{d2}$ is associated with a measurement at $t_{d1}$ with stronger gradient such that, for this pair, the condition of step F) is met.

The influence of chemical shift is eliminated in that a "quasi spin echo" is generated and evaluated in the phase direction rather than in the reading direction, i.e. the measuring points are, in each case, at the same relative point in time ($t_{d1}$, $t_{d2}$) after excitation and do not differ with respect to dephasing through chemical shift. It is recommended to select the times $t_{d1}$, $t_{d2}$ such that the fatty and water contributions of the signals in the $B_0$ field are at least approximately in phase.

The time $t_d$ can be selected largely freely and can, in particular, be very short for samples with short relaxation times $T_1/T^*_2$.

The method has been described above with reference to one direction but can be easily applied for several directions. Compensation in two dimensions is advantageous, in particular, for investigations of slices of an object. In multiple slice investigations, the field can be homogenized separately for each slice.

It is of course possible to extend the method in a corresponding manner to three-dimensional volumes by carrying it out analogously for a further dimension to permit homogenization of the field in the entire sample volume or, in connection with volume-selective measures, for selected partial volumes and optionally for many different volumes within an object.

In a particularly advantageous fashion, the method is carried out analogously for a plurality of predetermined directions which are selected such that, according to methods known per se, the principal expansion coefficients of a series expansion of the magnetic field $B_0$ in spherical harmonic functions can be determined, in particular, those of second order. An article by R. Gruetter in Magnetic Resonance in Medicine 29:804–811 (1993) describes e.g. a shimming method with the title "Fastmap". In a preferred variant, measurement is carried out along only six projection directions for determining the coefficients up to second order inclusively. These directions can be utilized in the present method in accordance with the invention.

Depending on the shim and gradient coil equipment of the apparatus and depending on the object, the method in accordance with the invention is preferably carried out analogously for a plurality of predetermined directions which are selected such that the correction currents can be determined with methods known per se for shim coils or gradient coils of predetermined correction field profiles. These field profiles may coincide—but must not—with the profiles which are predetermined by the corresponding pure spherical harmonic functions.

This method is preferably a method of nuclear magnetic resonance and, in particular, is incorporated in a method of magnetic resonance imaging. Nuclear magnetic resonance imaging apparatus and, to an increasing extent, high-resolution nuclear magnetic resonance spectroscopy apparatus are provided with gradient coils and shim systems as standard equipment. The method can be integrated into the existing software of, in particular, imaging apparatus without any hardware problems. In particular, it can be added to the actual measurement or be completely integrated therein, such that the field is newly homogenized during the investigation program. As mentioned above, homogenization can be carried out individually for separate partial investigation areas.

In an embodiment of the invention, the method is carried out in two dimensions and is preceded by a slice selection step, possibly including step A), which selects a slice in the investigation object perpendicular to a direction.

Alternatively, it is preceded by a volume selection step, possibly including step A), which selects a volume in the investigation object.

With multiple volume experiments or multiple slice experiments, several sets of correction field profiles are determined which are associated with different volumes or slices.

Correction currents can be determined from the extracted profiles for input into shim coils of the apparatus.

Alternatively, or additionally, one can determine offset currents from the extracted profiles for input into gradient coils of the apparatus thereby allowing particularly simple modification of the currents even during a pulse program. The use of other means for field homogenization instead of shim coils is fundamentally possible, e.g. ferromagnetic or permanent-magnetic shim plates, whose number and/or position must be determined.

In one embodiment, the sample comprises biological tissue. The above-mentioned advantages of the invention have a particularly positive effect with inhomogeneous samples having fatty and water constituents whose exact position might not be known. The same is true for biological samples such as test animals or also human patients. In the inventive method, an inaccurately centered sample produces measurement errors of lower order during determination of the coefficients of a given order which, in turn, can be eliminated through further iterations determining precisely this order.

Further advantages can be extracted from the drawing and the description. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and explained in more detail by means of embodiments.

BRIEF DESCRIPTION OF THE DRAWING

FIG. 1 schematically shows RF excitations, phase gradients and measuring signals for a predetermined direction

DESCRIPTION OF THE PREFERRED EMBODIMENT

The first line of FIG. 1 schematically shows the time dependence of an excited NMR signal after a radio frequency excitation pulse (t=0), symbolized here by a vertical black bar. Each of the following four curves represents a dependence of the signal envelopes after excitation for differing strengths of the respective phase gradient. They are slightly modified by the overlapping field inhomogeneities of the magnetic field $B_0$ to be determined (not shown). Measurements are carried out at times $t_{d1}$ and $t_{d2}$, respectively. In FIG. 1, the times $t_{d1}$ and $t_{d2}$ differ but are identical for all different strengths of the phase gradients $G_{p1}$ or $G_{p2}$ (see second line) applied in the direction p. When the direction p of the phase gradient has changed, the times $t_{d1}$ or $t_{d2}$ can remain unchanged. This is, however, not absolutely necessary.

The second line of FIG. 1 shows, in each case, the time dependence of the phase gradients $G_{p1}$ or $G_{p2}$ whose directions p coincide. In the example, the phase gradient is switched on after the RF pulse and is present during data recording. This is not absolutely necessary. It is only important that the integral of the gradient strength in the interval between RF pulse (t=0) and data recording $t=t_{d1}$ or $t=t_{d2}$ is systematically varied and that $t_{d1}$ and $t_{d2}$ remain constant for each selected direction P. It is also important that each time integral of the gradient strengths between t=0 and $t=t_{d1}$ and between t=0 and $t=t_{d2}$ are equal for a measuring pair, with detection at $t_{d1}$ and $t_{d2}$, i.e. that dephasing after excitation due to the phase gradients $G_{p1}$ and $G_{p2}$ coincides (however, not the dephasing due to other field inhomogeneities, since $t_{d1}$ and $t_{d2}$ are different). In the simplest case, the phase gradient acts with constant strength $Gp_1$ and $Gp_2$ in the entire interval between t=0 and t=$t_{d1}$ and t=0 and t=$t_{d2}$. Then $G_{p1}*t_{d1}=G_{p2}*t_{d2}$ for a measuring pair.

The third line shows the dependence of the signal phase $\phi_1$ and $\phi_2$, for the direction p used for the phase gradient ($G_{p1}$, $G_{p2}$) in the phase direction p, i.e. as function of the spatial direction $D_p$ corresponding to the phase gradient ($G_{p1}$ and $G_{p2}$), In column 1 ($t_{d1}$, $G_{p1}$, $\phi_1$), the Fourier-transformed signal was phase-corrected for reasons of clarity, i.e. the phase is now constant. In column 2 ($t_{d2}$, $G_{p2}$, $\phi_2$), the same phase correction was used as in column 1. Column 3 finally shows the difference between the two phase dependences which is a direct indication of the field error profile produced by the field inhomogeneities in the base magnetic field $B_0$ along the measured projection. The method in accordance with FIG. 1 is repeated for a further direction p and a phase difference and thus a field error profile is also produced in this direction. The directions p can be described and selected according to criteria known per se, e.g. such as in the method known as "Fastmap", and coefficients of a series expansion of the field and/or correction currents can be gained therefrom for shim and/or gradient coils.

It is clear that the method can be combined with many pulse sequences common in magnetic resonance or can be integrated therein.

I claim:

1. A method of determining and correcting higher order magnetic field inhomogeneities of a nearly homogeneous magnetic field $B_0$ in an investigation volume of a magnetic resonance apparatus, wherein magnetic resonance is excited in a sample located in the investigation volume through a radio frequency pulse, at least one additional, linear magnetic gradient field is applied and a magnetic resonance signal is measured, the method comprising the steps of:
   a) irradiating a first excitation radio frequency pulse onto the sample;
   b) applying a first phase gradient $G_{ix1}$ in a predetermined direction x;
   c) measuring, at a fixed time $t_{dx1}$ after said first excitation radio frequency pulse, a value $S_{ix1}$ of a magnetic resonance signal from the sample;
   d) digitizing and storing said value $S_{ix1}$ measured in step c);
   e) irradiating a second excitation radio frequency pulse onto the sample;
   f) applying a second phase gradient $G_{ix2}$ in said predetermined direction x;
   g) measuring, at a fixed time $t_{dx2}$ after said second radio frequency excitation pulse, a value $S_{ix2}$ of a magnetic resonance signal from the sample, wherein $G_{ix2\ and\ tdx2}$ are selected such that the integrals $$\int_0^{tdx1} Gx1\,dt = \int_0^{tdx2} Gx2\,dt$$

are equal;
   h) digitizing and storing said value $S_{ix2}$;
   i) repeating steps a) to h) a plurality of times with systematically altered strength of said phase gradient $G_{ix}$;
   j) combining, in dependence on an associated gradient strength $G_{ix}$, values of said measured resonance signals $S_{ix1}$, into a quasi-spin echo data set $S_{x1}$;
   k) combining, in dependence on said associated gradient strength $G_{ix}$, said values of said measured resonance signals $S_{ix2}$, into a quasi-spin echo data set $S_{x2}$;
   l) Fourier transforming said data set $S_{x1}$;
   m) Fourier transforming said data set $S_{x2}$, wherein a difference $\phi_{ix1}-\phi_{ix2}$ between phases of the signals $S_{ix1}$ and $S_{ix2}$ represent a measure of a profile of magnetic field inhomogeneities along said direction x; and
   n) applying, in subsequent measurements of magnetic resonance in the apparatus, a correction magnetic field B(x) in the investigation volume for homogenizing the magnetic field $B_0$ to compensate for said magnetic field inhomogeneities determined in step m).

2. The method of claim 1, further comprising phase correcting said Fourier transformed data set $S_{x1}$ such that phases $\phi'_{ix1}$ of phase corrected resonance signals $S'_{ix1}$ all have an essentially same value, and phase correcting said Fourier transformed data set $S_{x2}$ with same parameters as said data set $S_{x1}$ to obtain phase corrected resonance signals $S'_{ix2}$, wherein a difference $\phi'_{ix1}-\phi'_{ix2}$ between phase-corrected phases of said signals $S'_{ix1}$ and $S'_{ix2}$ represent a measure of a profile of magnetic field inhomogeneities along said direction x.

3. The method of claim 1, further comprising repeating the method analogously for at least one further predetermined direction y.

4. The method of claim 3, wherein said direction y is perpendicular to said direction x.

5. The method of claim 1, further comprising repeating the method analogously for a plurality of predetermined directions, said plurality of predetermined directions selected to determine principal expansion coefficients of a series expansion of the magnetic field $B_0$ in spherical harmonic functions.

6. The method of claim 5, wherein said expansion coefficients are of second order.

7. The method of claim 1, further comprising repeating the method analogously for a plurality of predetermined directions, said plurality of predetermined directions selected to determine parameters of at least one of shim coils, gradient coils and homogenization means, having respectively predetermined correction field profiles.

8. The method of claim 1, wherein said subsequent measurements are nuclear magnetic resonance measurements.

9. The method of claim 1, wherein said subsequent measurements are magnetic resonance imaging measurements.

10. The method of claim 9, wherein the method is carried out within a plane and is preceded by a slice selection step to select a slice in the investigation volume.

11. The method of claim 10, wherein said slice selection step includes step a).

12. The method of claim 9, wherein the method is preceded by a volume selection step which selects a chosen volume in the investigation volume.

13. The method of claim 12, wherein said volume selection step includes step a).

14. The method of claim 12, wherein several sets of correction gradient fields are determined, which are associated with different volumes.

15. The method of claim 1, wherein correction currents are determined from extracted correction gradient magnetic fields for input into shim coils of the apparatus.

16. The method of claim 1, wherein offset currents are determined from extracted correction gradient magnetic fields for input into gradient coils of the apparatus.

17. The method of claim 1, wherein at least one of a number and positions of ferromagnetic or permanent-magnetic shim plates are determined from extracted correction gradient magnetic fields.

18. The method of claim 1, wherein the sample comprises biological tissue.

19. The method of claim 1, wherein the sample has at least one of a very short $T_1$ relaxation time and a very short $T_2$ relaxation time.

* * * * *